United States Patent [19]

Nuijten

[11] Patent Number: 5,398,287
[45] Date of Patent: Mar. 14, 1995

[54] VOICE ACTIVATED MULTIPLE MICROPHONE ELECTROACOUSTIC AMPLIFIER SYSTEM

[75] Inventor: Cornelis P. C. Nuijten, Breda, Netherlands

[73] Assignee: U.S. Philips Corporation, New York, N.Y.

[21] Appl. No.: 889,207

[22] Filed: May 27, 1992

[30] Foreign Application Priority Data

May 29, 1991 [EP]  European Pat. Off. ............ 91201279

[51] Int. Cl.⁶ .............................................. H04R 3/00
[52] U.S. Cl. ........................................ 381/96; 381/93; 379/395
[58] Field of Search ............ 381/110, 92, 94, 93, 381/95, 96; 379/390, 389, 395, 420, 391, 202, 206

[56] References Cited

U.S. PATENT DOCUMENTS

| | | | |
|---|---|---|---|
| 4,090,032 | 5/1978 | Schrader | 381/110 |
| 4,192,979 | 3/1980 | Jankowski, Jr. | 381/110 |
| 4,378,603 | 3/1983 | Eastmond | 455/79 |
| 4,628,526 | 12/1986 | Germer | 381/108 |
| 4,991,166 | 2/1991 | Julstrom | 379/390 |

FOREIGN PATENT DOCUMENTS 2174268  10/1986  United Kingdom .

Primary Examiner—Curtis Kuntz
Assistant Examiner—Ping W. Lee
Attorney, Agent, or Firm—Bernard Franzblau

[57] ABSTRACT

An electroacoustic amplifier arrangement comprises a plurality of microphone arrangements each of which includes a microphone coupled to a comparator and coupled via a coupling circuit to a variable gain amplifier. The amplifier arrangement further includes a threshold signal generator. The threshold signal generator has a first and a second input coupled to the input and output, respectively, of the amplifier and is arranged to derive a threshold signal as a function of the signals applied to its two inputs. The output of the threshold signal generator is coupled to a second input of the comparator. The threshold signal generator is arranged to derive a threshold signal as a function of the gain factor adjusted in the amplifier.

21 Claims, 3 Drawing Sheets

VOICE ACTIVATED MULTIPLE MICROPHONE ELECTROACOUSTIC AMPLIFIER SYSTEM

BACKGROUND OF THE INVENTION

This invention relates to an electroacoustic amplifier arrangement, comprising a plurality of microphone arrangements, each microphone arrangement comprising a microphone. The microphones of the microphone arrangements being each connectable with an input of amplifier means having an output coupled to a loudspeaker arrangement for triggering at least one loudspeaker associated to the loudspeaker arrangement. A threshold signal generator generates a threshold signal and presents this threshold signal to an output. A microphone arrangement comprising means for coupling or not an output of the associated microphone to the input of the amplifier means dependent upon the presence or absence, respectively, of a control signal. A comparing means has a first input coupled to the output of the microphone, a second input coupled to the output of the threshold signal generator and an output coupled to a control signal input of the coupling means. The comparing means is arranged to compare the microphone signal fed to its first input with the threshold signal fed to its second input and generates the control signal in response to the two signals. The coupling means is arranged to couple the output of the microphone to the input of the amplifier means in the presence of the control signal and to a microphone arrangement to be used in the electroacoustic amplifier arrangement.

The amplifier arrangement of the type mentioned in the opening paragraph is known from GB 2 174 268A and is used, for example, in conference systems. An conferees are located in a conference room in which a sound reproducing system comprising amplifiers and loudspeakers is installed. The conferees each have the disposal of a microphone station which includes a microphone by way of which the conferees' contributions may be reproduced in amplified version in the room by the sound reproducing system. The loudspeakers may be mounted somewhere in the room. Loudspeakers may sometimes be included in the microphone stations. A still further possibility is that the loudspeaker arrangement comprises only loudspeakers included into the microphone stations.

The microphones generally have a so-called voice switch for avoiding, for example, acoustic feedback into the conference room. When a conferee does not speak into his microphone, the microphone is disconnected from the sound reproducing system. When the conferee starts speaking into his microphone, the microphone is connected to the input of the sound reproducing system if there is a sufficiently high microphone signal, so that the conferee's speech is amplified by way of the sound reproducing system. The known microphone arrangement therefore comprises a threshold signal generator means which derives a threshold signal from the signal fed to the loudspeakers. If the microphone signal exceeds this threshold signal, the microphone is coupled to the input of the sound reproducing system.

The prior-art amplifier arrangement, however, has the drawback that microphones are sometimes still connected while the conferee is not speaking. This may lead to the occurrence of acoustic feedback. Another drawback is that in a system in which only a limited number of microphones can be connected, microphones that are activated in the proper fashion indeed, may perhaps not be connected.

SUMMARY OF THE INVENTION

It is an object of the invention to provide an amplifier arrangement in which it is better established whether a microphone is to be connected or not.

The amplifier arrangement according to the invention is accordingly characterized in that the threshold signal generator means has a first and a second input coupled to the amplifier means and the threshold signal generator means is arranged derive from the signals applied to the first and second inputs a threshold signal as a function of the gain factor adjusted in the amplifier means. The invention is based on the recognition that there is a relationship between the adjusted gain factor in the amplifier means and the acoustic properties of the room in which the amplifier arrangement is installed. The room may have, for example, an acoustically "dead" character. In that case there is a short reverberation time of the room. This is the case, for example, if the room has acoustically absorbing walls, or if there are many people in the room itself. The acoustic field in the room is then mainly determined by the direct sound (the direct field) of the loudspeakers.

The room may also have a "reverberating" character. In that case the reverberation time of the room is long. This is the case, for example, if the room has acoustically hard (reflecting) walls, or if there are only a few people in the room. The acoustic field in the room is now determined both by the direct sound (the direct field) of the loudspeakers and the indirect sound (the diffuse field) or reverberation. This diffuse field is developed once the sound waves have reflected a number of times against the walls.

If the room has a "dead" character, a high gain factor is to be adjusted in the amplifier means so as to realize a properly audible reproduced speech via the sound reproducing system. If the room has a more reverberating character, a high gain factor will easily lead to acoustic feedback. This means that the gain factor will be selected to be smaller in that case. This explains why there is a correlation between the magnitude of the gain factor and the acoustic property of a room.

Let us assume that a burst-like signal is reproduced in the room via the amplifier means for a specific period of time. In the prior-art threshold signal generator this burst-like signal produced a threshold signal present for this same time interval and possibly even for a second directly consecutive time interval, the length of this second time interval being related to the time the direct sound needs to go from the loudspeaker arrangement to the microphone. The reverberation time in a reverberating room is sometimes much longer than this second time interval, so that immediately after the threshold signal has disappeared at the end of the second time interval, the microphone is nevertheless switched on as a result of the reverberation still present in the room.

According to the invention, it is established in the threshold signal generator means whether a high or just a low gain factor has been adjusted in the amplifier means. If a low gain factor appears to have been adjusted, this denotes that the room has a rather reverberating character, so that the diffuse sound field in the room may be taken into account when the threshold signal is derived.

In a further embodiment the amplifier arrangement is characterized in that the second input of the threshold signal generator means is coupled to the output of the amplifier means, in that the threshold signal generator means comprises first and second signal amplitude detecting means inserted between the first and the second input respectively, and the output of the threshold signal generator means, in that the first and second signal amplitude detecting means have a specific charge time constant for charging up to the value of the signal amplitude and a specific discharge time constant for discharging after the signal amplitude has disappeared, and in that the first and the second signal amplitude detecting means have, relative to each other, a large and small charge and discharge time constant, respectively.

BRIEF DESCRIPTION OF THE DRAWING

The invention will be further explained in the following description with reference to the accompanying drawing of a number of exemplary embodiments, in which.

DESCRIPTION OF THE PREFERRED EMBODIMENTS

Figure 1:
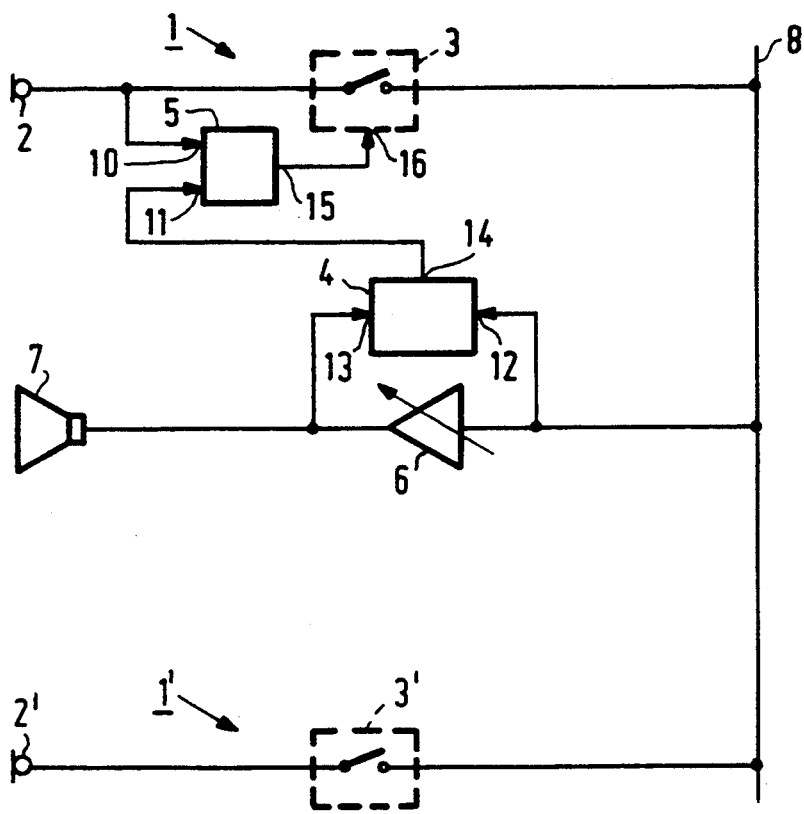
FIG. 1 shows a first exemplary embodiment.

FIG. 1 shows a diagram of the electroacoustic amplifier means comprising a number of microphone arrangements. A microphone arrangement may be used by one or more conferees. One microphone arrangement is shown in FIG. 1 and is denoted by reference numeral 1. The microphone arrangement comprises a microphone 2, coupling means 3, a threshold signal generator means 4 and a comparator means 5. The amplifier arrangement comprises an amplifier means 6 and a loudspeaker arrangement 7. The amplifier means 6 is used for triggering at least one loudspeaker in the loudspeaker arrangement 7.

The loudspeaker arrangement 7 may be formed by a number of loudspeaker boxes mounted in the room. The loudspeaker arrangement 7 may also be formed by a single loudspeaker included in the microphone station 1. Other microphone stations, such as a microphone station 1' shown in FIG. 1, each comprise an associated loudspeaker. Needless to observe that there may be both loudspeaker boxes mounted in the room and loudspeakers included in the microphone stations.

The amplifier means 6 amplifies an electrical audio signal present on the line 8. This may be a matter of a microphone signal coming from a speaker delivering a speech to the conferees, or a microphone signal coming from one of the microphone arrangements 1, 1'. For this purpose, the microphones 2, 2' in the arrangements 1, 1' are coupled to the line 8 via the coupling means 3, 3'.

The microphone 2 is coupled to an input 10 of the comparator means and to a terminal of the coupling means 3, which coupling means are realised as a controllable switch. The input and output of the amplifier 6 are coupled to an input 12 and an input 13 respectively, of the threshold signal generator 4, an output 14 of which is coupled to the input 11 of the comparator means 5. An output 15 of the comparator means 5 is coupled to the control signal input 16 of the coupling means or switch 3.

The operation of the arrangement is as follows. The audio signal on the line 8 is reproduced via the loudspeaker arrangement 7 in the room in which the conference is being held and thus provides an acoustic contribution to the microphone 2 via the acoustic path from the loudspeaker arrangement 7 to the microphone 2. In order to avoid feedback occurring, the microphone 2 is decoupled from the amplifier means 6. This denotes that the switch 3 is open. No control signal is then applied to the control signal input 16 of switch 3, or put differently, the control signal input is supplied with a control signal so that the switch is open. The control signal is derived by the comparator 5 which compares the microphone signal with a threshold signal supplied to the comparator 5 by the threshold signal generator 4. If the microphone signal appears to be smaller than the threshold signal, no control signal will be generated, or a first control signal will be generated, so that the switch 3 is open. If the conferee to whom the microphone is assigned starts speaking into the microphone at a sufficiently high level, the microphone signal will exceed the level of the threshold signal. The comparator 5 then generates a (second) control signal so that the switch 3 closes and the microphone is coupled to the input of the amplifier means 6. The words spoken into the microphone 2 are then reproduced in amplified version in the room via the loudspeaker arrangement 7.

Figure 2:
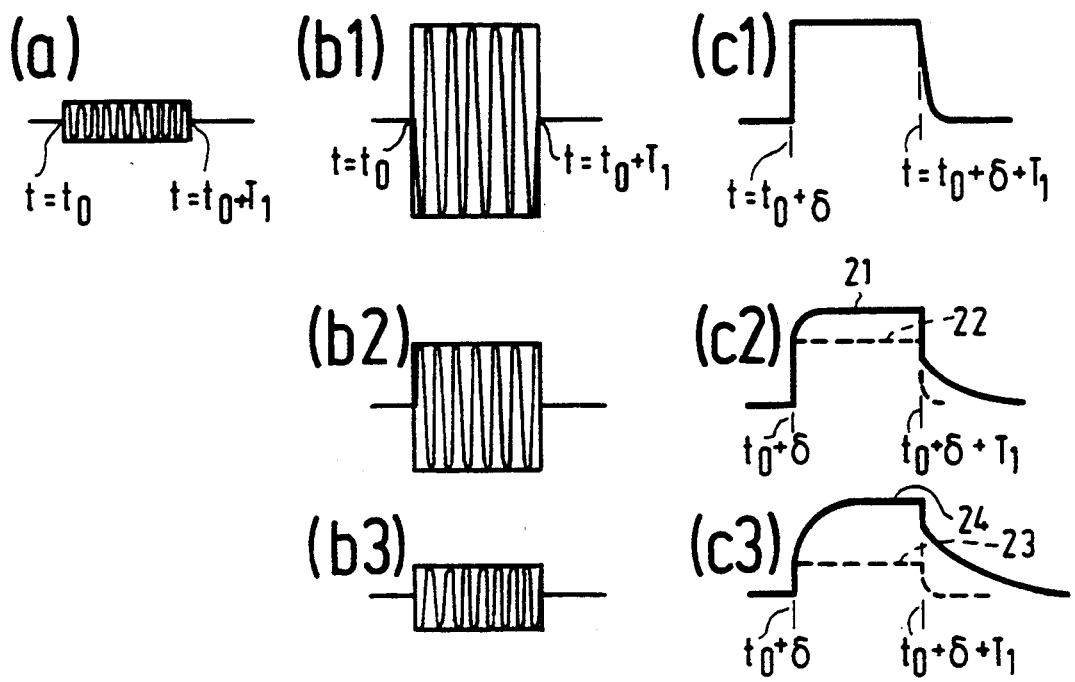
FIG. 2 shows the operation of the threshold signal generator means in the exemplary embodiment shown in FIG. 1 for three values of the gain factor in the amplifier means, FIG. 3 gives a further elaboration of the exemplary embodiment shown in FIG. 1, and FIG. 4 gives a further elaboration of the unit 45 in the exemplary embodiment shown in FIG. 3.

Deriving the threshold signal in the generator 4 will now be explained. The threshold signal generator 4 is supplied with both the input signal and the output signal of the amplifier means 6. Let us assume that a burst-like audio signal having a specific frequency is applied to the input of the amplifier 6 for a time interval $T_1$, cf. FIG. 2(a). Depending on the gain factor adjusted in the amplifier 6, an amplified signal having a specific amplitude will be presented at the output of the amplifier 6. FIG. 2(b1) shows the output signal of the amplifier 6 with the maximum adjustment of the gain factor. FIG. 2(b2) shows the output signal with a gain factor that is, for example, 4 dB lower than in the case of FIG. 2(b1), and FIG. 2(b3) shows the output signal with a gain factor that is, for example, 10 dB lower than in the case of FIG. 2(b1). The output signal is always a burst-like signal having a specific amplitude which is smaller according as the adjusted gain factor is lower. Obviously, the burst-like output signal ideally has a length $T_1$.

As observed in the introductory part, the height of the adjusted gain factor provides information on the acoustic properties of the room in which the arrangement is mounted. If the gain factor is large, the room will have a rather "dry" character and there will be hardly any reverberation. This is the situation of FIG. 2(b1). If the room appears to be more "reverberating", the gain factor will be adjusted to a lower value. This is the situation depicted in FIG. 2(b2) and FIG. 2(b). Depending on the adjusted gain factor, the generator 4 is thus set to generate a different threshold signal. This is represented by means of the FIGS. 2(c1), 2(c2) and 2(c3).

If a high gain factor is adjusted, FIG. 2(b1), the generator 4 will generate a threshold signal as represented in FIG. 2(c1). In an acoustically "dry" room, the acoustic field in the room is essentially determined by the direct field, that is to say, by the direct transfer of acoustic waves from the loudspeaker arrangement 7 to the microphone 2. The delay of the acoustic waves from the loudspeaker to the microphone 2 is then assumed to be equal to $\delta$. The threshold signal generated by the generator 4 is thus to be present at least from the instant $t = t_0 + \delta$ and is to remain present until, after the burst, also the acoustic signal at the microphone 2 has disappeared. This means that the threshold signal is present at least up to the instant $t = t_0 + \delta + T_1$. Since even an acoustically "dry" room has a (be it) short reverberating time, the threshold signal will not directly disappear after this instant, but fade off fast to the zero value. The beginning of the occurrence of the threshold signal could be as early as at the instant $t = t_0$. The fading off of the threshold signal, however, is not to begin until the instant $t = t_0 + \delta + T_1$.

If a slightly lower gain factor is adjusted, FIG. 2(b2), a threshold signal as represented in FIG. 2(c2) will be generated. In a room having a slightly reverberating character, the transfer of the acoustic signal from the loudspeaker 7 to the microphone 2 is determined both by the direct transfer and the indirect transfer. By means of curve 21 in FIG. 2(c2) the threshold signal as generated by generator 4 is plotted against time. Curve 22 in FIG. 2(c2) denotes the threshold signal that would be generated if exclusively the direct field were taken into consideration. The curve 22 exhibits a similar variation to the curve of FIG. 2(c1). The ratio of the thresholds of the threshold signals in FIGS. 2(c1) to 2(c2) corresponds to the ratio of the amplitudes of the burst signals in the FIGS. 2(b1) to 2(b2). The curve 21 in FIG. 2(c2) is constituted by the curve 22 and an additional contribution, that is, the difference between the curves 21 and 22, which is a measure of the contribution as a result of the indirect field of the acoustic signal at the microphone 2. Clearly noticeable in FIG. 2(c2) is the fact that from the instant $t = t_0 + \delta$ there is a growing contribution as a result of the indirect (or diffuse) field. After the instant $t = t_0 + \delta + T_1$ the threshold signal slowly fades off in accordance with the die-out time (reverberating time) of the room.

If a still lower gain factor is adjusted, cf. FIG. 2(b3), the threshold signal as shown in FIG. 2(c3) by means of the curve 24 will be generated. In a room having a strongly reverberating character, the acoustic transfer from the loudspeaker 7 to the microphone 2 is, in essence, determined by the contribution as a result of the indirect (or diffuse) field. The curve 23 shown in FIG. 2(c3) indicates the threshold signal which would be generated if again exclusively the direct field were taken into consideration. The threshold value of the curve 23 is, in essence, 10 dB lower than the threshold of the curve shown in FIG. 2(c1). The curve 24 is constituted by the curve 23 and a large contribution, the difference between the curves 23 and 24, as a result of the indirect field. From the instant $t = t_0 + \delta$ this contribution augments until the threshold signal has a value of about $3 \times$ the threshold as a result of the direct field only. From the instant $t = t_0 + \delta + T_1$ the threshold reduces again in accordance with the die-out time (reverberating time) of the room. The reverberating time is in this case larger than in the case of FIG. 2(c2) so that the threshold signal now also dies out more slowly than in the case of FIG. 2(c2).

In the exemplary embodiment shown in FIG. 1 the loudspeaker may be a loudspeaker included in the microphone station 1. The microphone station 1' then comprises a loudspeaker 7' (not shown) triggered by an associated amplifier 6' (not shown). The circuit for triggering the switch 3', which circuit is associated with the microphone station 1', then looks exactly like the one associated with the microphone station 1 shown in FIG. 1.

If the loudspeaker 7 is a loudspeaker box mounted in the hall, the threshold signal derived by the generator 4 may be used as a threshold signal in the microphone station 1', which then further includes only a comparator means 5' (not shown) for deriving the control signal for the switch 3'. The generator 4 will in that case not be included in the station 1 but will be arranged at some central location.

Figure 3:
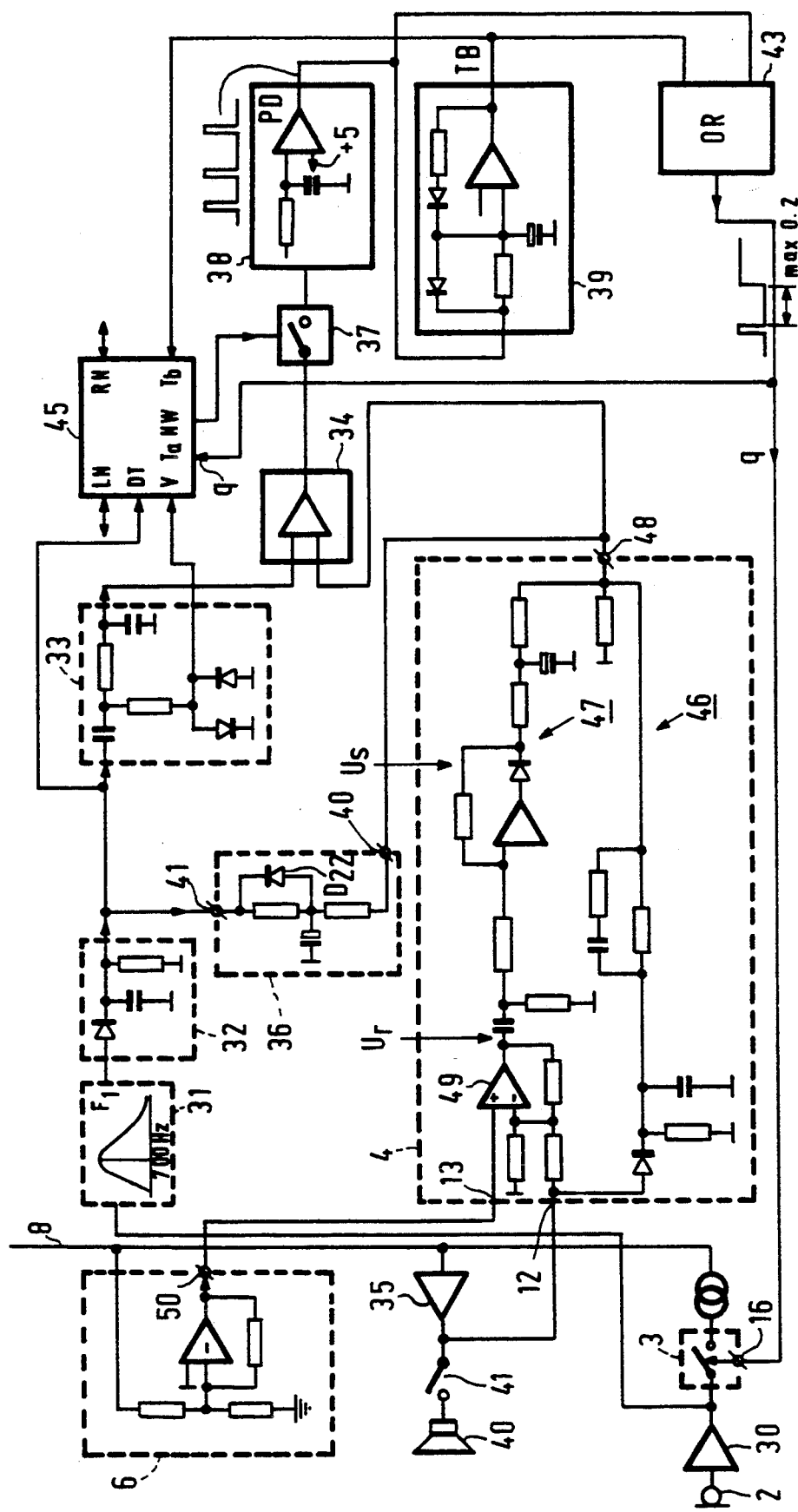

FIG. 3 illustrates further elaboration of the arrangement shown in FIG. 1 in which the audio signals of the microphones, such as the microphone 2, are supplied to the amplifier means 6 in this case by means of a current source control.

The output of the microphone 2 is coupled to the input of a filter $F_1$ referenced 31 via a microphone pre-amplifier 30. The filter is intended to filter and detect the speaker's speech sound. For that matter, the filter characteristic has, in essence, a bandpass characteristic with a peak at about 700 Hz. The output of the filter 31 is coupled to an input of an envelope detector 32. In the envelope detector 32 the signal is rectified and the RC time of the envelope detector is selected such that the envelope best matches the envelope of a speech signal. The envelope signal is then applied to a change detector 33 detecting only the changes in the envelope. The detector 33 thereto comprises a high-pass filter having a breakpoint selected in such a way that even the slowest change can still be detected. The roll-off frequency is then situated at, for example, about 5 Hz.

The signal on line 8, once it has been amplified in the amplifier stage 35, is applied to the input 12 of the threshold signal generator 4. The output signal of the amplifier stage 35 may also be applied to a loudspeaker 40 belonging to the microphone station. This is possible if the switch 41, operable by the user of the station, is switched on.

The unadjusted signal of the amplifier 6, present on the terminal 50, is applied to the input 13 of the threshold signal generator 4. In the case of a high value for the gain factor adjusted in the amplifier 6, there are signals at the inputs 12 and 13 of the threshold signal generator 4, so that a zero-voltage appears at the output of the amplifier stage 49. Then a signal will appear at the output 48 of the generator 4 which signal is, in essence, determined by the signal present at the input 12 of the generator 4. The generator 4 now has a first transfer path 46 between the input 12 and the output 48 with a specific charge time constant $T_{u1}$ and a specific discharge time constant $T_{d1}$, and a second transfer path 47 between the input 13 and the output 48 with a specific charge time constant $T_{u2}$ and a discharge time constant $T_{d2}$. For these charge time constants and discharge time constants it holds that $T_{u1}$ is smaller than $T_{u2}$ and that $T_{d1}$ is smaller than $T_{d2}$. The small charge and discharge time constants for the transfer path 46 from the input 12 to the output 48 results in the behaviour shown in FIGS. 2a, 2(b1) and 2(c1). In this case, via the second transfer path 47, there is no contribution to the signal available at the output 48.

When a lower gain factor is adjusted in the amplifier means 6, there will be a lower signal level at the output 12. This corresponds to the curves 22 and 23 in the drawing FIGS. 2(c2) and 2(c3). With a decreasing signal at the input 12 an ever increasing signal is developed at the output of the stage 49, so that an ever increasing contribution from the signal transfer via the second transfer path 47 appears at the output 48. Due to the longer charge and discharge time constants in this transfer path 47, a signal appears at the output 48 as is represented by the curves 21 and 24 in the drawing FIGS. 2(c2) and 2(c3).

The output of the generator 4 is coupled to an output 40 of an ambient noise canceller 36. The output of the envelope detector 32 is coupled to an input 41 of the canceller 36. The canceller 36 is inserted for realising an even better cancelling of the possibility of the microphone being switched on due to ambient noise. For this purpose, the threshold in the canceller 36 is linearly increased by the microphone signal while only the slow changes effect an enhancement of the threshold.

An enhancement of the threshold signal level corresponds to the speech behaviour because, if the ambient noise rises by 6 dB, one is inclined to speak 3 dB louder. The diode $D_{22}$ in the canceller 36 realises an automatic change from the time constant in the canceller 36 once a speech signal has been fed to the microphone. The output signal of the change detector 33 and the summed output signals of the threshold generator 4 and the canceller 36 are applied to a comparator 34. If the output signal of the detector 33 is larger than the summed signals of the generator 4 and the canceller 36, the output of the comparator 34 becomes positive. The output signal of the comparator 34, when switch 37 is closed, is applied to a pulse detector 38 which generates a pulse if the output signal of the comparator 34 is in a "high" state for at least 10 ms. This is done to avoid brief disturbances which cause a control signal to be generated. This pulse is applied to a pulse stretcher 39. The pulse stretcher 39 generates a 2-second-long pulse if two or more pulses of the detector 38 are supplied within 100 ms.

The output signals of the pulse detector 38 and pulse extender 39 are combined in an OR gate 43 so as to obtain the control signal q by which the switch 3 is triggered. A continued speech signal at the microphone output thus continuously produces pulses at the output of the comparator 34 which lead to a control signal q. If the speech signal stops, the control signal q will disappear 2 seconds after the last pulse of the pulse detector 38.

Each microphone station further includes a unit 45. The unit 45 is intended to avoid the problem wherein, when the speaker, who has been assigned to the microphone 2 starts speaking, also neighbouring microphones will be switched on. In order to avoid this, use is made of delay differences between the speaker's mouth and the various neighbouring microphones. The microphone receiving the speech signal first is then switched on, whereas the neighbouring microphones are blocked. The unit 45 comprises inputs $T_a$, DT, V and $T_b$, an output NW and in/outputs LN and RN. The in/output LN is coupled to the in/output RN of the unit 45' (not shown) which belongs to a neighbouring microphone station to the left and the in/output RN is coupled to the in/output LN of the unit 45" (not shown) belonging to a neighbouring microphone station to the right. The input DT of the unit is coupled to the output of the envelope detector 32. The input V is coupled to the change detector 33. The input $T_b$ is coupled to the output of the pulse stretcher 39 and the input $T_a$ is supplied with the control signal q. The output NW is coupled to the control signal input of the switch 37.

Figure 4:
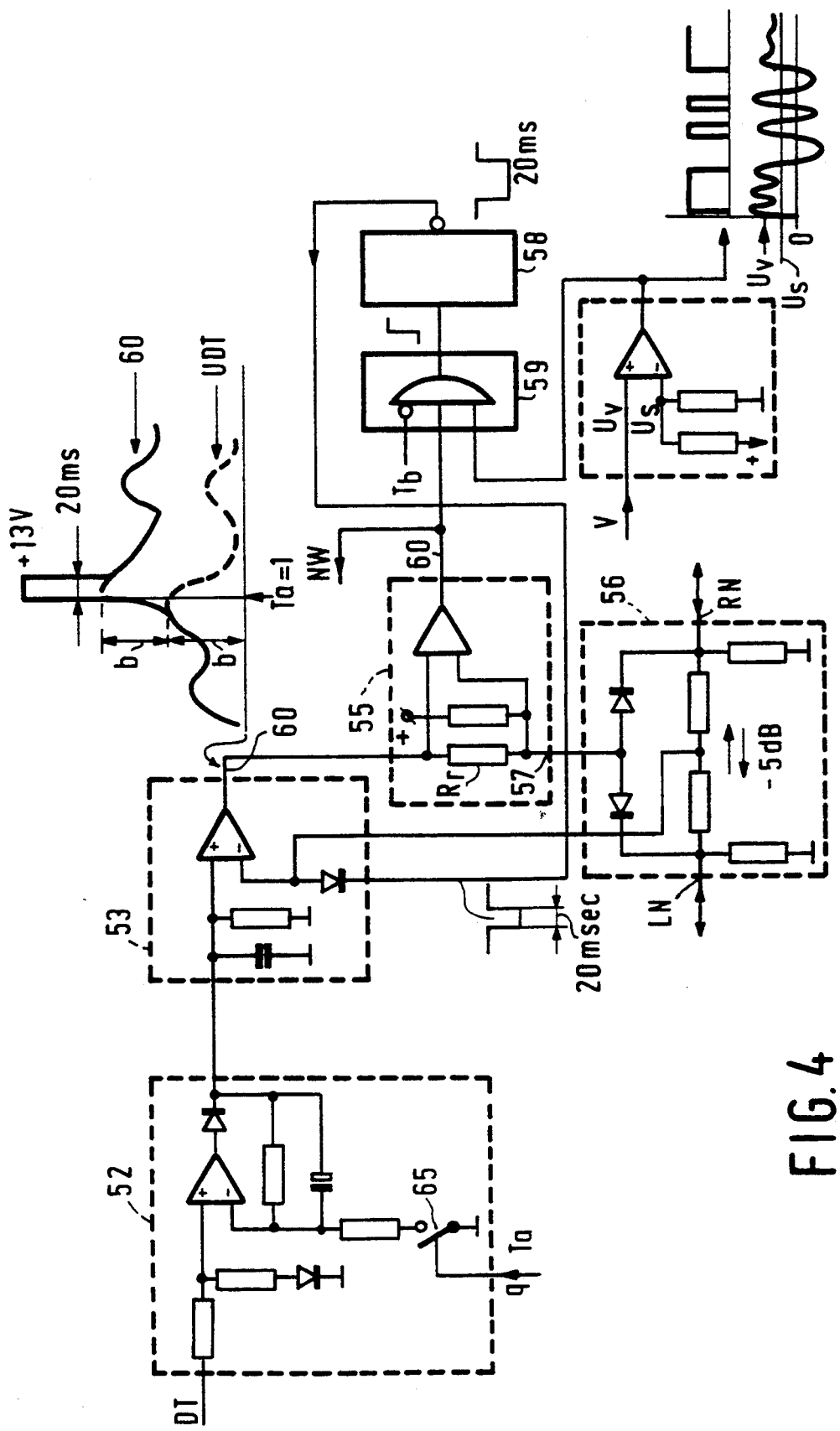

FIG. 4 gives a further elaboration of the unit 45. The detection in the units 45 is actually based on comparing the moment of detection of the wave front of the speaker's own station with that of the neighbouring stations. The station at which the wave front arrives first is closest to the speaker and is thus to be activated. The input DT of the unit 45 is coupled to the input of a unit 52. If the station is activated, which means that $T_a$ is high and thus the switch in unit 52 is closed, the detected value will be retained in unit 52 for some time. The reason for this is that the wave front cannot arrive at the other stations until some time later and may perhaps already have disappeared at the station of origin. The signal in unit 52 is also amplified by 6 dB. The reason for this is that, as a result of the spread in the microphone sensitivities and deviations in the direction characteristics of the microphones in the various stations, the signal of a neighbouring station may even be larger than the microphone signal of the station to be activated. The value retained in unit 52 is applied via a follower 53 to a weighing bridge unit 55 and, through the circuit 56 is, applied to the neighbouring stations through the outputs LN and RN. The circuit 56 further provides that the signal generated by the neighbouring station on the left is applied to the middle station and from there transferred to the neighbouring station on the right attenuated by about 5 dB. The weighing bridge unit 55 delivers a positive voltage at its terminal 60 as long as the output signal at the output of the follower 53 of the speaker's own station is greater than the signal produced by one of the neighbouring stations via the inputs LN or RN. This also happens if the station's own signal is positive earlier than those of the neighbouring stations. This is realised by means of the current direction detection across resistor $R_r$ in unit 55. If the speaker's own station is activated, that is to say, if the control signal q is generated, a blocking pulse will be produced at the outputs LN and RN for 20 ms. This blocking pulse is generated by the pulse generator 58 and insures that the neighbouring stations cannot block this station for the duration of this pulse. The generator 58 will not generate a pulse until three conditions are satisfied: a. the wave front of the speaker's own station is to arrive first (that is to say, the output 60 of the weighing bridge unit 55, and thus the signal at the output NW, becomes positive), b. the speech filter 31 must have detected speech (that is to say, the output V of the change detector 33 and thus the signal at the output V of the unit 45 exhibits a positive change), and c. the switch 3, and thus the station, must not yet have been activated (that is to say, that the signal at the input $T_b$ is zero). Because the signal at the input $T_b$ after inversion is applied to the AND gate 59, at that moment this gate produces an ascending edge which leads to a blocking pulse at the output of the generator 58.

If the switch 3 has been activated, which means that the control signal q is applied to the unit 52, so that the switch 65 in this unit 52 is closed, the station enhances the signal at the terminals LN and RN by 6 dB as has already been stated hereinbefore.

Self-evidently, should neighbouring signals not be weighed in the arrangement shown in FIG. 3, as has been described with reference to FIG. 4, the unit 45 may be omitted and the switch 37 replaced by an interconnection.

I claim:

1. An electroacoustic amplifier arrangement comprising: a plurality of microphone arrangements, each microphone arrangement comprising a microphone with each of the microphones connectable to an input of an amplifier means having an adjustable gain factor and an amplifier output coupled to a loudspeaker arrangement for driving at least one loudspeaker associated with the loudspeaker arrangement, a threshold signal generator means for generating at its output a threshold signal, a microphone arrangement further comprising:

coupling means for selectively coupling an output of an associated microphone to the input of the amplifier means as a function of the presence or absence respectively, of a control signal, comparing means having a first input coupled to the output of the microphone, a second input coupled to the output of the threshold signal generator means and an output coupled to a control signal input of the coupling means whereby the comparing means compares a microphone signal fed to the first input with the threshold signal fed to the second input and in response generates the control signal, and wherein the coupling means couple the output of the microphone to the input of the amplifier means in the presence of the control signal and to a further microphone arrangement of the electroacoustic amplifier arrangement, wherein the threshold signal generator means has a first and a second input coupled to the amplifier means and is arranged to derive from the signals applied to its first and second inputs a threshold signal as a function of the gain factor adjusted in the amplifier means.

2. An electroacoustic amplifier arrangement as claimed in claim 1, wherein the threshold signal generator means derives a threshold signal from the signals applied to its first and second inputs which is determined in part by the contribution of the acoustic transfer of the acoustic signals from the loudspeaker arrangement to a microphone which is the result of a diffuse sound field present in a room in which the amplifier arrangement is installed.

3. An electroacoustic amplifier arrangement as claimed in claim 2, wherein the threshold signal generator means determines, on the basis of the signals applied to its two inputs, whether a relatively high or a relatively low gain factor has been adjusted in the amplifier means, in that the adjustment of a relatively low gain factor denotes a non-negligible contribution to said acoustic transfer from the diffuse sound field in the room compared with the contribution to said acoustic transfer from the direct sound field in the room such that the threshold generator means derives a threshold signal at least partly determined by contributions from the diffuse sound field.

4. An electroacoustic amplifier arrangement as claimed in claim 2 wherein the second input of the threshold signal generator means is coupled to the output of the amplifier means, in that the threshold signal generator means comprises first and second signal transmission means coupled between the first and the second input respectively, and the output of the threshold signal generator means, wherein the first and second signal transmission means each have a specific charge time constant for charging up in response to a signal applied thereto and a specific discharge time constant for discharging the signal, and in that the first and the second signal transmission means have, relative to each other, a large and small charge and discharge time constant, respectively.

5. An electroacoustic amplifier arrangement as claimed in claim 1 wherein at least one microphone arrangement further comprises means operative independently of the number of microphones turned on for blocking the control signal in a neighbouring microphone arrangement if the comparator means in the one microphone arrangement has generated the control signal earlier than the comparator means in the neighbouring microphone arrangement.

6. An electroacoustic amplifier arrangement as claimed in claim 1 wherein the second input of the threshold signal generator means is coupled to the output of the amplifier means, in that the threshold signal generator means comprises first and second signal transmission means coupled between the first and the second input respectively, and the output of the threshold signal generator means, wherein the first and second signal transmission means each have a specific charge time constant and a specific discharge time constant, and in that the first and the second signal transmission means have, relative to each other, a large and small charge and discharge time constant, respectively.

7. An electroacoustic amplifier arrangement as claimed in claim 6 wherein at least one microphone arrangement further comprises means for blocking the control signal in a neighbouring microphone arrangement if the comparator means in the one microphone arrangement has generated the control signal earlier than the comparator means in the neighbouring microphone arrangement.

8. An electroacoustic amplifier arrangement as claimed in claim 1 wherein the first and second inputs of the threshold generator means are coupled to the input and the output, respectively, of the amplifier means.

9. An audio amplifier arrangement comprising:
a loudspeaker arrangement including at least one loudspeaker,
an adjustable gain amplifier means having an input and an output and with said output coupled to the loudspeaker arrangement for driving said at least one loudspeaker,
a threshold voltage generator having first and second inputs coupled to the input and output, respectively, of said adjustable gain amplifier means so as to derive at its output a threshold voltage determined only by the gain factor adjusted in the amplifier means, and
a plurality of microphone arrangements with each microphone arrangement comprising;
a microphone,
comparison means having a first input coupled to an output of the microphone and a second input coupled to the output of the threshold voltage generator, and
switching means controlled by a control signal developed by said comparison means and operative to selectively couple the output of the microphone to the input of the amplifier means via a line common to at least one other microphone arrangement.

10. An audio amplifier arrangement as claimed in claim 9 wherein a further one of said microphone arrangements comprises an individual comparison means having a first input coupled to the output of its respective microphone and a second input coupled to said output of the threshold voltage generator.

11. An audio amplifier arrangement as claimed in claim 9 wherein said threshold voltage generator produces a burst-like audio signal whose amplitude varies directly as a function of the adjusted gain factor of said amplifier means.

12. An audio amplifier arrangement as claimed in claim 9 wherein said threshold voltage generator includes a time constant circuit whereby the threshold voltage produced comprises a rectangular-like waveform with a generally exponential-like trailing edge.

13. An amplifier arrangement as claimed in claim 12 wherein said threshold voltage generator includes a further time constant circuit whereby the rectangular-like waveform has an exponential-like leading edge which has a longer rise time as the gain factor of the amplifier means is adjusted to a lower value.

14. An audio amplifier arrangement as claimed in claim 9 wherein the output of a microphone is directly coupled to a series circuit comprising a first filter, an envelope detector and a high-pass filter, and with an output of said series circuit coupled to said first input of the comparison means, and circuit means controlled by the output of the comparison means for supplying said control signal to the switching means.

15. An audio amplifier arrangement as claimed in claim 9 wherein said second input of the threshold voltage generator is directly connected to the output of the adjustable gain amplifier means, wherein the output threshold voltage derived by the threshold voltage generator is independent of output signals produced by microphones of other microphone arrangements of the audio amplifier arrangement.

16. An audio amplifier arrangement as claimed in claim 9 wherein said voltage threshold generator comprises first and second signal paths coupled to said first and second voltage threshold generator inputs, respectively, and each with a respective time constant, wherein the time constant of the first signal path is shorter than the time constant of the second signal path.

17. An audio amplifier arrangement as claimed in claim 9 wherein the microphone arrangement further comprises means for blocking the control signal in a neighbouring microphone arrangement if the comparator means in the microphone arrangement has generated the control signal earlier than the comparator means in the neighbouring microphone arrangement, said blocking means being controlled in part by a signal derived from its associated microphone, an output signal derived from the output of its comparison means and the control signal for the switching means of its microphone arrangement.

18. An audio amplifier arrangement as claimed in claim 9 wherein the output of the comparison means is coupled to a control input of the switching means, but is isolated from the inputs of the comparison means so that there is no feedback therebetween.

19. An electroacoustic amplifier arrangement comprising:

a loudspeaker arrangement including at least one loudspeaker, an adjustable gain amplifier having an input and an output and with said output coupled to said at least one loudspeaker, a threshold voltage generator having first and second inputs coupled to said adjustable gain amplifier so as to derive at its output a threshold voltage signal determined by the gain factor adjusted in the adjustable gain amplifier, and a plurality of microphone arrangements with each microphone arrangement comprising;

a microphone, comparison means having a first input coupled to an output of the microphone and a second input coupled to the output of the threshold voltage generator thereby to compare an output signal of the microphone with the threshold voltage signal, and switching means controlled by a control signal developed by said comparison means and operative to selectively couple the output of the microphone to the input of the amplifier via a line common to at least one other microphone arrangement.

20. An electroacoustic amplifier as claimed in claim 19 wherein the adjusted gain factor in the adjustable gain amplifier is a function of the acoustic properties (reverberating characteristic) of a room in which are located the at least one loudspeaker and said microphone.

21. An electroacoustic amplifier arrangement as claimed in claim 19 further comprising an ambient noise canceler circuit having an input coupled to the output of the microphone and an output coupled to the second input of the comparison means.

* * * * *